(12) United States Patent
Nakano et al.

(10) Patent No.: US 9,530,751 B2
(45) Date of Patent: Dec. 27, 2016

(54) DIE BONDER AND BONDING METHOD

(71) Applicant: Fasford Technology Co., Ltd., Minami-Alps, Yamanashi (JP)

(72) Inventors: Kazuo Nakano, Tokyo (JP); Koji Nakamura, Tokyo (JP); Shoji Kanai, Tokyo (JP); Fukashi Tanaka, Tokyo (JP)

(73) Assignee: Fasford Technology Co., Ltd., Minami-Alps (JP)

( * ) Notice: Subject to any disclaimer, the term of this patent is extended or adjusted under 35 U.S.C. 154(b) by 0 days.

(21) Appl. No.: 14/699,609

(22) Filed: Apr. 29, 2015

(65) Prior Publication Data

US 2016/0099225 A1  Apr. 7, 2016

(30) Foreign Application Priority Data

Apr. 30, 2014  (JP) ................................ 2014-093757

(51) Int. Cl.
*B23K 37/00* (2006.01)
*H01L 23/00* (2006.01)
(Continued)

(52) U.S. Cl.
CPC .............. *H01L 24/75* (2013.01); *B23K 3/087* (2013.01); *B23K 37/04* (2013.01); *H01L 21/6836* (2013.01); *H01L 24/83* (2013.01); *H01L 25/50* (2013.01); *H01L 2224/27003* (2013.01); *H01L 2224/7501* (2013.01); *H01L 2224/7565* (2013.01); *H01L 2224/7598* (2013.01);
(Continued)

(58) Field of Classification Search
None
See application file for complete search history.

(56) References Cited

U.S. PATENT DOCUMENTS 3,698,618 A * 10/1972 Helda .................. B23K 20/023
228/1.1
3,873,144 A * 3/1975 Diepeveen ........ H01L 21/67144
228/44.7
(Continued)

FOREIGN PATENT DOCUMENTS

JP        03204949 A  *  9/1991
JP        05160331 A  *  6/1993
(Continued)

OTHER PUBLICATIONS

Korean Office Action issued in counterpart Korean Application No. 10-2015-0061329 dated Mar. 22, 2016 (four (4) pages).

*Primary Examiner* — Kiley Stoner
(74) *Attorney, Agent, or Firm* — Crowell & Moring LLP

(57) ABSTRACT

A die bonder and a bonding method are provided that are capable of surely mounting a die on an intermediate stage and surely picking up the die from the intermediate stage and thus, are high in reliability. The die bonder is provided with the intermediate stage for mounting thereon the die picked up by the pickup head from a die supply unit. A mounting portion of the intermediate stage is provided with an uneven pattern including a plurality of mounting support protrusions having contact surfaces that flush contact the back surface of the die for supporting the die not to slip out of place, and a plurality of recesses formed between the mounting support protrusions.

18 Claims, 9 Drawing Sheets

(51) Int. Cl.
  *B23K 3/08* (2006.01)
  *B23K 37/04* (2006.01)
  *H01L 21/683* (2006.01)
  *H01L 25/00* (2006.01)
(52) U.S. Cl.
  CPC .............. *H01L 2224/75252* (2013.01); *H01L 2224/75745* (2013.01); *H01L 2224/75753* (2013.01); *H01L 2224/75822* (2013.01); *H01L 2224/75824* (2013.01); *H01L 2224/83132* (2013.01); *H01L 2224/83862* (2013.01); *H01L 2224/92* (2013.01); *H01L 2224/94* (2013.01)

(56) References Cited

U.S. PATENT DOCUMENTS

| | | | | |
|---|---|---|---|---|
| 3,934,782 | A | * | 1/1976 | Cushman .............. B22D 25/04 164/334 |
| 3,957,185 | A | * | 5/1976 | Kauffman ......... H01L 21/67144 228/106 |
| 5,227,003 | A | * | 7/1993 | Takeuchi ............... B23K 3/087 156/499 |
| 6,201,306 | B1 | * | 3/2001 | Kurosawa ......... H01L 21/67144 228/102 |
| 6,244,493 | B1 | * | 6/2001 | Shimazaki ............ B23K 20/26 228/5.5 |
| 7,060,528 | B2 | * | 6/2006 | Nishikawa .............. H01L 24/11 257/E21.508 |
| 2005/0003636 | A1 | * | 1/2005 | Takyu .................... H01L 24/29 438/464 |
| 2005/0061856 | A1 | * | 3/2005 | Maki ..................... H01L 21/561 228/234.1 |
| 2006/0197260 | A1 | * | 9/2006 | Yoshikawa ............ B23K 26/10 264/482 |
| 2008/0157303 | A1 | * | 7/2008 | Yang ..................... H01L 21/568 257/676 |
| 2008/0245472 | A1 | * | 10/2008 | Hirata ................. B32B 38/1833 156/264 |
| 2009/0075458 | A1 | * | 3/2009 | Nakamura ........... B28D 5/0011 438/464 |
| 2009/0197395 | A1 | * | 8/2009 | Nakamura ......... B23K 26/0853 438/463 |
| 2010/0093131 | A1 | * | 4/2010 | Maeda ................. B23K 1/0016 438/107 |
| 2012/0146242 | A1 | * | 6/2012 | Fujishima ............. H01L 21/561 257/777 |
| 2012/0234496 | A1 | * | 9/2012 | Maruo .................. B25B 11/005 156/538 |
| 2013/0095613 | A1 | | 4/2013 | Tanaka |
| 2014/0091458 | A1 | * | 4/2014 | Van Gemert ........ H01L 21/561 257/737 |

FOREIGN PATENT DOCUMENTS

| | | | |
|---|---|---|---|
| JP | 07065925 | A * | 3/1995 |
| JP | 8-115930 | A | 5/1996 |
| JP | 2000150547 | A * | 5/2000 |
| JP | 2009-246285 | A | 10/2009 |
| JP | 2013-102126 | A | 5/2013 |

* cited by examiner

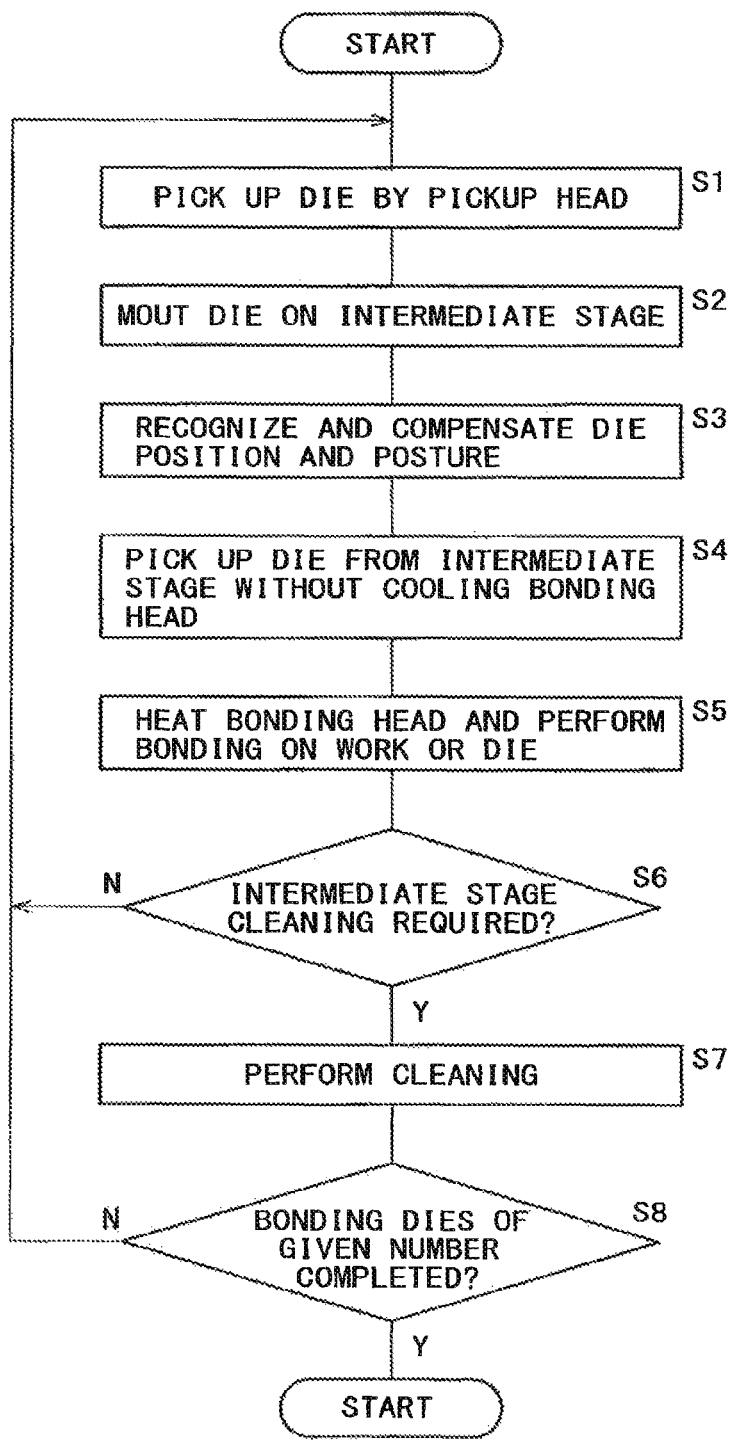

DIE BONDER AND BONDING METHOD

CLAIM OF PRIORITY

The present application claims priority from Japanese patent application JP2014-093757 filed on Apr. 30, 2014, the content of which is hereby incorporated by reference into this application.

BACKGROUND

The present invention relates to a die bonder and a boding method and particularly, to a die bonder and a bonding method capable of surely mounting dies and thus, being highly reliable.

Steps for mounting dies (semiconductor chips) (hereafter referred to simply as dies) on works such as wiring substrates, lead frames and the like to assemble electronic components include as parts thereof a step of splitting dies from a semiconductor wafer (hereinafter, referred to simply as wafer), a step of picking up a split die from the wafer, and a bonding step of mounting the picked-up die on a work or laminating the picked-up die on an already bonded die.

As methods for performing the bonding step, there is a method of mounting a die picked up from a wafer on an intermediate stage and again picking up the die by a bonding head from the intermediate stage to bond the die on a work conveyed to come (for example, JP2009-246285 A)

Further, it may be the case that at a die supply unit for holding a wafer, dies have adhesive material called die attach film put on back surfaces thereof.

SUMMARY

However, in the die bonder with the intermediate stage, the die picked up from the wafer is once placed on the intermediate stage, at which time the die attach film on the back surface of the die directly contacts a surface of the intermediate stage. The die attach film inherently contains a strongly adsorbent material, and thus, if foreign substances were stored on the intermediate stage, such foreign substances would be absorbed to the die attach film surface to be bonded on the work as they are. The foreign substances put between the work and the die attach film, where being large (for example, 20 micron-meters or larger), cannot be absorbed by the thickness of the die attach film. In addition, where the thickness of the die is such a degree as, for example, 20 micron-meters or less, foreign substances become a cause to produce cracks or voids in the die.

Further, the die attach film is strong in absorbability and thus, it may occur that the die clings to the intermediate stage where the die is left as it is on the intermediate stage for a long period of time. In this case, there arises a possibility that the die is failed to be picked up from the intermediate stage or that cracks are produced in the die due to a stress exerted thereon when the die is picked up. To this end, in the prior art like the aforementioned Japanese patent application, a coating on the surface is performed as measures against the cling. However, the coating becomes a source that produces foreign substances because of peeling off by friction, cleaning or the like.

Furthermore, as sources of foreign substances that can adhere to the intermediate stage, there are, in addition to peeling-off fragments of the coating, the remnants of the die attach film, those adhered to the wafer, fragments produced when the die is thrusted upward from the wafer, and those produced in the system by the driving of ball screws or the like. Particularly, the remnants of the die attach film and the peeling-off fragments of the coating are, in these days, important objects as foreign substances.

Accordingly, an object of the present invention is to provide a die bonder and a die bonding method being capable of surely mounting a die on an intermediate stage and surely picking up the die from the intermediate stage and hence, being high in reliability.

In order to accomplish the aforementioned object, a die bonder according to the present invention is exemplified, wherein an intermediate stage for mounting a die picked up by a pickup head from a die supply unit is provided at a mounting portion with an uneven pattern including a plurality of mounting support protrusions having contact surfaces that flush contact the back surface of the die for supporting the die not to slip out of place, and a plurality of recesses formed between the mounting support protrusions.

Further, in order to accomplish the aforementioned object, a die bonding method according to the present invention is exemplified, which comprises a first pickup step of picking up a die by a pickup head from a die supply unit, a mounting step of mounting the die picked up by the pickup head from the die supply unit on a mounting surface of an intermediate stage according to the present invention, a second pickup step of picking up the die mounted on the intermediate stage by a bonding head, and a bonding step of bonding the die on a work or on a die already mounded on the work.

Furthermore, the area of contact surfaces of all of the mounting support protrusions that contact the back surface may be 10 percents or less of the area of the back surface or the area of the contact surfaces of all of the mounting support protrusions provided at the mounting portion may be 10 percents or less of the area of the mounting portion.

Further, between the mounting support protrusions, there may be provided plane keeping protrusions having contact surfaces that flush contact the back surface of the die for decreasing the flexure of the die to keep planeness.

Still furthermore, the uneven pattern may be high in density at a central part or a peripheral part of the mounting portion.

Alternatively, the contact surfaces of the mounting support protrusions may be provided at the mounting portion in an island array, or the mounting support protrusions may be provided at the mounting portion to be beltlike in a concentric circle or ellipse array, or the recesses may be provided to be beltlike in parallel to a side of the mounting portion.

Still furthermore, a step of heating the bonding head and the second pickup step may be performed with the bonding head kept in a heated state.

According to the present invention, it can be realized to provide the die bonder or the bonding method being capable of surely mounting the die on the intermediate stage and surely picking up the die from the intermediate stage and thus, being high in reliability.

BRIEF DESCRIPTION OF THE DRAWINGS

FIG. 10 is a chart showing one example of a bonding flow where the intermediate stages in the present invention are used, in a fourth embodiment of the present invention.

DETAILED DESCRIPTION OF THE PREFERRED EMBODIMENTS

Hereafter, examples in embodiments of the present invention will be described with reference to the drawings.

Figure 1:
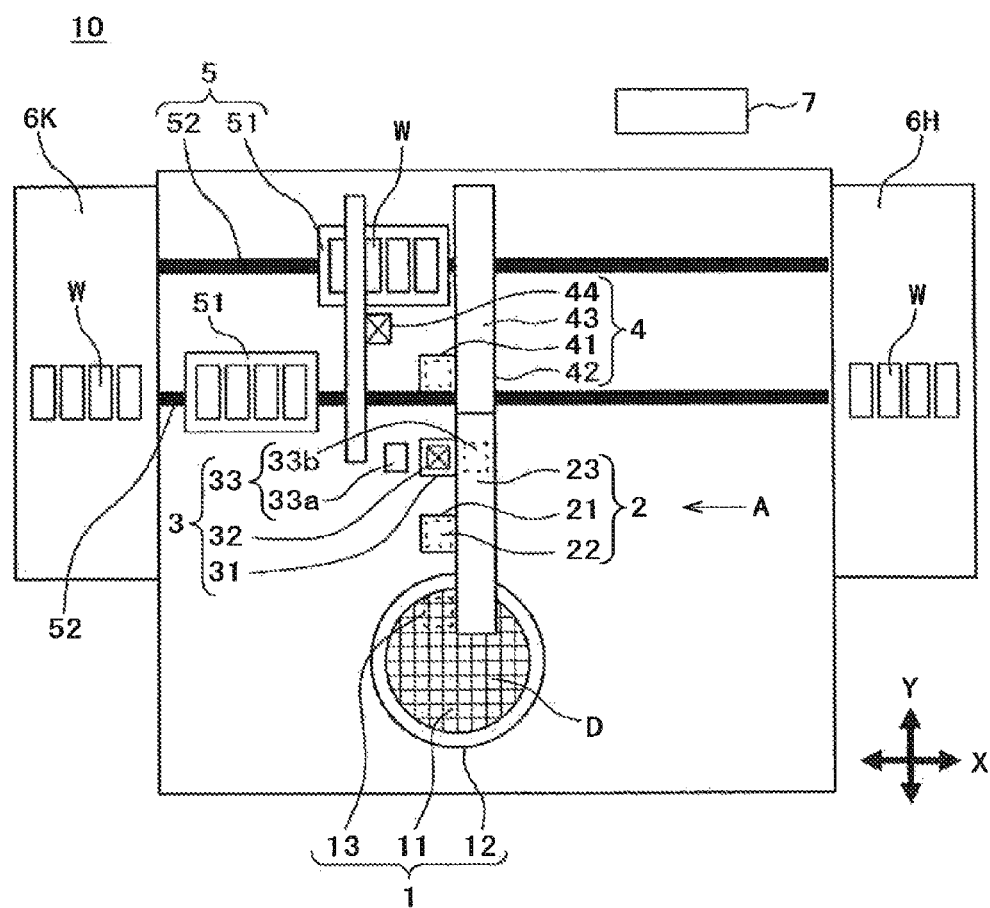
FIG. 1 is a schematic plan view of a die bonder being one embodiment of the present invention.
Figure 2:
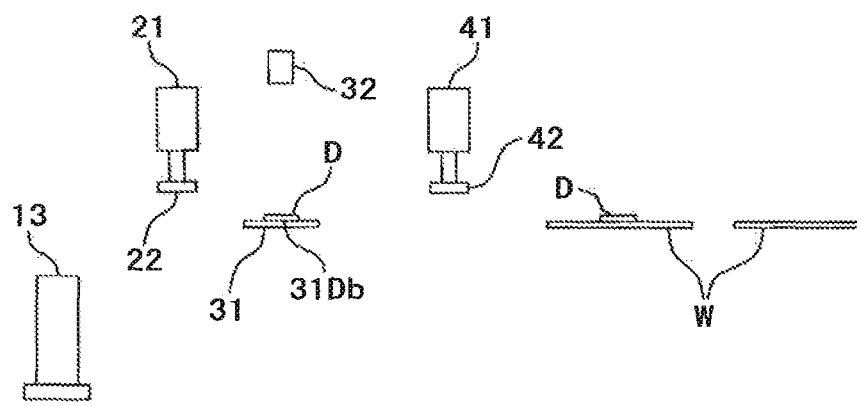
FIG. 2 is an illustration as viewed in the direction of an arrow A in FIG. 1 for explaining the operations of a pickup head and a boding head.

FIG. 1 is a schematic plan view of a die bonder 10 being one embodiment of the present invention. FIG. 2 is an illustration as viewed in the direction of an arrow A in FIG. 1 for explaining the operations of a pickup head 21 and a boding head 41.

The die bonder 10, where classified roughly, comprises a die supply unit 1, a pickup unit 2, an intermediate stage unit 3, a bonding unit 4, a conveyance unit 5, a substrate supply unit 6K, a substrate carry-out unit 6H, and a control unit 7 for monitoring and controlling the operations of the respective units.

First of all, the die supply unit 1 supplies dies D to be mounted on a work W. The die supply unit 1 includes a wafer holding base 12 for holding a wafer 11 and a thrust-up unit 13 indicated by a broken line for thrusting a die D upward from the wafer 11. The die supply unit 1 is moved by drive means (not shown) in an X-Y direction to move a die D to be picked up to a position over the thrust-up unit 13.

The pickup unit 2 picks up the die D from the die supply unit 1 and mounts the picked-up die D on an intermediate stage 31 referred to later. The pickup unit 2 includes a pickup head 21 for picking up a die D and a pickup head Y drive unit 23 for moving the pickup head 21 in the Y-direction.

The pickup head 21 includes a collet 22 (also refer to FIG. 2) for sucking and holding the thrusted-up die D at a tip end thereof (also refer to FIG. 2). The pickup head 21 picks up the die D and mounts the same on the intermediate stage 31. The pickup head 21 incorporates respective drive units (not shown) for moving the collet 22 vertically, rotationally and in the X-direction.

The intermediate stage unit 3 includes the intermediate stage 31 incorporating features of the present embodiments referred to later for mounting a die D thereon temporarily and a stage recognition camera 32 for recognizing the die D on the intermediate stage 31. The intermediate stage 3 may include a foreign substance removal device 33 for cleaning foreign substances on the intermediate stage 31 away. The foreign substance removal device 33 includes an air blower 33a for blowing air and a vacuum device 33b for drawing the removed foreign substances. Reference symbol 32b in FIG. 2 designates the back surface of a die D.

The bonding unit 4 picks up a die D from the intermediate stage 31 and bonds the die D on a work W conveyed to come or on a die already bonded on the work W to be laminated thereon. The bonding unit 4 includes a bonding head 41 provided, like the pickup head 21, with a collet 42 (also refer to FIG. 2) for sucking and holding a die D at a tip end thereof, a Y-drive unit 43 for moving the bonding head 41 in the Y-direction, and a substrate recognition camera 44 for picking up the image of a position recognition mark (not shown) on a work W to recognize a bonding position.

With the construction like this, the bonding head 41 compensates the pickup position and posture based on the image pickup date of the stage recognition camera 32, then picks up the die D from the intermediate stage 31 and bonds the die D on the work W based on the image pickup date of the substrate recognition camera 44.

The conveyance unit 5 includes substrate conveyance pallets 51 each with one or plural pieces of works W (4 pieces in FIG. 1) mounted thereon and pallet rails 52 along which the substrate conveyance pallets 51 are moved, and is composed of first and second conveyance units of the same construction provided in parallel. The substrate conveyance pallet 51 is moved when a nut (not shown) provided in the substrate conveyance pallet 51 is driven by a ball screw (not shown) provided along the pallet rail 52.

With the construction like this, the substrate conveyance pallet 51 has works W mounted at the substrate supply unit 6K, is moved to a bonding position along the pallet rail 52 and, after bonding operations, is moved to the substrate carry-out unit 6H to deliver the works W to the substrate carry-out unit 6H. The first and second conveyance units are driven independently of each other, so that while dies D are being bonded on the works W mounted on one of the substrate conveyance pallets 51, the other substrate conveyance pallet 51 carries the works W thereon out and is returned to the substrate supply unit 6K to prepare for the mounting of new works W or the like.

Figure 3:
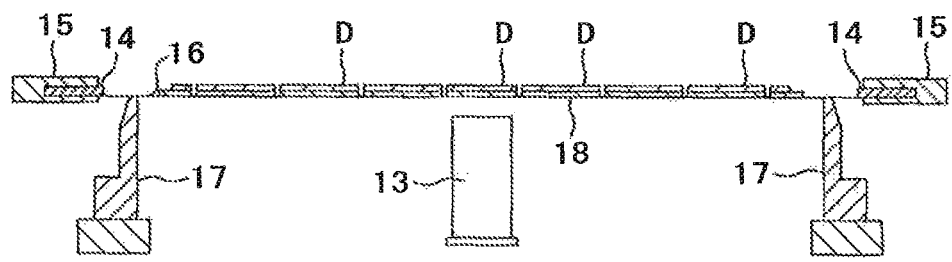
FIG. 3 is a rough sectional view showing a main part of a die supply unit in the one embodiment of the present invention.

FIG. 3 is a rough sectional view showing an important part of the die supply unit 1. As shown in FIG. 3, the die supply unit 1 includes an expandable ring 15 for holding a wafer ring 14, a support ring 17 for horizontally positioning a dicing tape 16 which is held by the wafer ring 14 and to which a plurality of dies D are adhered, and the thrust-up unit 13 for thrusting a die D upward. In order to pick a given die D upward, the thrust-up unit 13 is able to be vertically moved by a drive mechanism (not shown), whereas the die supply unit 1 is able to be moved horizontally.

The die supply unit 1, at the time of thrusting the die D upward, downwardly moves the expandable ring 15 holding the wafer ring 14. As a result, the dicing tape 16 held by the wafer ring 14 is stretched to widen the intervals of the dies D. In such a state, a die D is thrusted upward by the thrust-up unit 13 from thereunder, so that the die supply unit 1 is improved in the capability of picking up the die D.

As dies become thinner and thinner, the adhesive used in adhering the dies to a work has been altered from fluid to film and thus, it may be the case that a film called die attach film 18 is provided between dies D and the dicing tape 16. The die attach film 18 has a film-like adhesive material applied thereto and holds a plurality of dies D. In the case where the wafer 11 has the die attach film 18, the dicing is performed with respect to the wafer 11 and the die attach film 18.

Therefore, when a die D is picked up from the wafer 11, the die attach film 18 adhered to the wafer 11 is peeled off together with the die D and the dicing tape 16. This die attach film 18 particularly causes the problem described earlier.

Hereafter, description will be made regarding the intermediate stage 31 that is one of the features of the present invention. As shown in FIG. 5B for example, the intermediate stage 31 in the present invention is provided with a stage portion 31s being a die mounting portion with an uneven pattern including mounting support protrusions 31v having contact surfaces that flush contact the back surface Db of the die D with the die attach film 18 for supporting the die D not to slip out of place, and recesses 31c formed between the mounting support protrusions 31v. Surrounded by a broken line is a part of the stage 31s. With the construction like this, the stage portion 31s, when mounting a die D, supports the die D at the mounting support protrusions 31v contacting the back surface Db (refer to FIG. 2) and receives foreign substances in the recesses 31c. As a result, even if there are produced foreign substances that are high in possibilities for the production of cracks, voids or the like in the die D as pointed out as the problem, many of the foreign substances are received in the recesses 31c. The foreign substances absorbed by the die attach film 18 and thus, being high in the possibility that produces cracks, voids or the like in the die D are only those that are possible to exist on the mounting support protrusions 31v.

Accordingly, in order to decrease cracks, voids or the like produced in the die D, it is important to reduce a contact area ratio SR, indicated in Expression (1), of an area Std of all of the mounting support protrusions 31v contacting the back surface Db of the die D to an area Sd of the back surface Db and to make the depth h of the recesses 31c deeper than the dimension of the foreign substances produced so that the foreign substances produced can be received in the recesses 31c.

$$SR=Std/Sd \qquad (1)$$

Further, where the mounting support protrusions 31v are provided uniformly over the stage portion 31s, a contact area ratio SRu becomes, as indicated in Expression (2), the ratio of an area Sts of all of the mounting support protrusions 31v to an area Ss of the stage portion 31s.

$$SRu=Rts/Ss \qquad (2)$$

As sources of foreign substances, there are remnants of die attach film, fragments peeled off coatings, those adhered to wafers, pieces of a die produced when the same is thrusted upward from a wafer, and those produced in the system by the driving of ball screws or the like. Although the depth h is desirable to be determined after the investigation of the dimension of foreign substances, it is practical to determine the depth h based on causes being high in contribution of those substances because the dimension of foreign substances is indistinct and difficult to investigate. With the advance of dies D to thin films, a primary cause seems as the remnants of the die attach film 18 that has a deep relation to the mounting of dies D on the intermediate stage 31 as well as to the picking-up of the die D from the intermediate stage 31. The depth of the die attach film 18 in recent years is in a range of 5 to 100 micron-meters.

Hereafter, the intermediate stage 31 will be described by the use of specific embodiments and examples in the embodiments.

First Embodiment

Figure 4A:
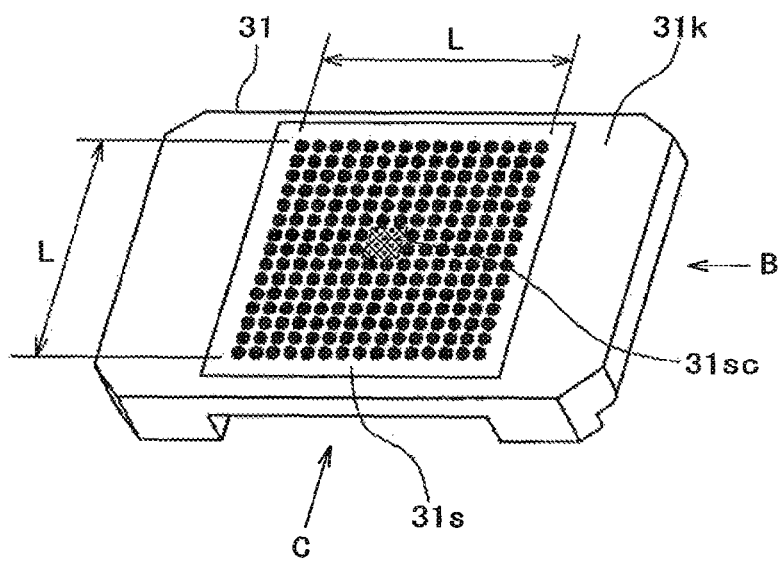
FIGS. 4A to 4C are views showing an intermediate stage in a first embodiment of the present invention.
Figure 4B:
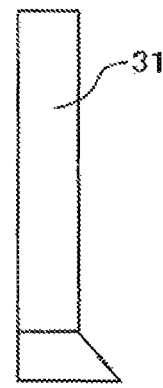
Figure 4C:
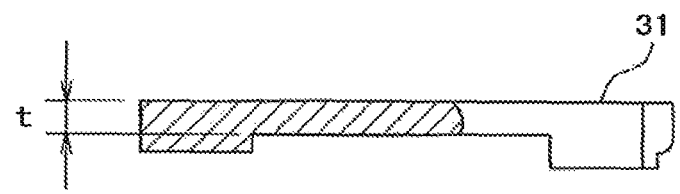

FIGS. 4A to 4C show an intermediate stage 31 being a first embodiment of the present invention. FIG. 4A is a perspective view of a stage portion 31s side of the intermediate stage 31 as viewed from an obliquely upper side. FIG. 4B is a side view of the intermediate stage 31 as viewed in the direction of an arrow B in FIG. 4A. FIG. 4C is a side view of the intermediate stage 31 as viewed in the direction of an arrow C in FIG. 4A and is illustrated partly as a sectional view. At the part of the sectional view in FIG. 4C, the mounting support protrusions 31v shown in FIG. 5B are not illustrated in the figure because the height h is, for example, one thirtieth (1/30) or so the thickness t of the stage portion 31s.

The intermediate stage 31 includes the stage portion 31s taking a regular square shape with a length L on each side and a stage fixing portion 31k provided around the stage portion 31s. The stage fixing portion 31K is fixed at a fixing portion (not shown) in FIG. 1 of the die bonder 10.

In the stage portion 31s in the first embodiment, the aforementioned uneven pattern is formed by the mounting support protrusions 31v in which the contact surfaces indicated as black-dotted marks for contact with the back surface Db of the die D are provided at the stage portion 31s in an island array, and the recesses 31c indicated in white between the mounting support protrusions 31v as a bottom portion of the stage portion 31s. A central region 31sc depicted as an obliquely reticulated part indicates a region that specifically represents the arrangement and shape of an uneven pattern over the whole of the stage portion 31s in first to third examples described later. That is, the uneven pattern in the central region 31sc spreads out over the whole of the stage portion 31s to define a whole uneven pattern.

However, it is not necessarily required for the pitch of the mounting support protrusions 31v or the recesses 31c to be fixed as indicated in FIG. 4A. For example, where a single intermediate stage 31 is used for those of a small dimension to a large dimension, the uneven pattern at the central part may be increased in density. Further, where the size of dies used on the intermediate stage 31 is determined and the dimension is particularly large, the uneven pattern at the peripheral part may be increased in density to prevent the die from turning up at peripheral pairs thereof. Moreover, the density of the uneven pattern, that is, the pitch of the mounting support protrusions 31v or the recesses 31c may be changed at random. Further, the shape in the island array of the mounting support protrusions 31v may be rectangular, circular or elliptical, and the contact areas in the island array of the mounting support protrusions 31v may not be uniform. To be important is that the mounting support protrusions 31v are able to mount and support the die D stably.

Regarding the aforementioned density of the uneven pattern made by the mounting support protrusions 31v, the same applies to uneven patterns in beltlike arrays in second and third embodiments described later.

Example 1

Figure 5A:
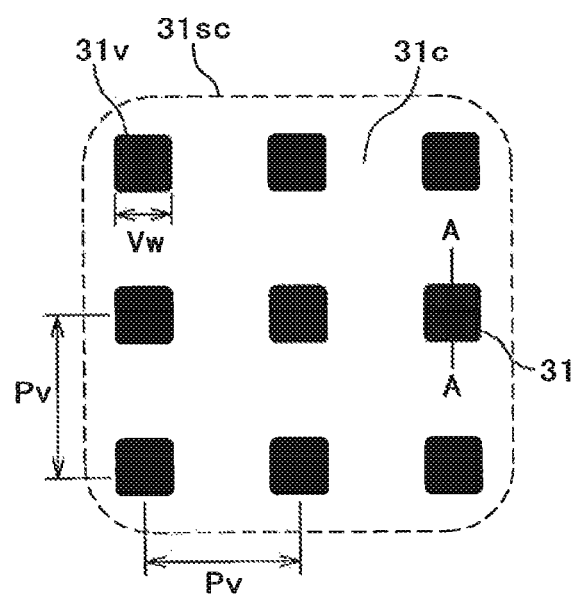
FIGS. 5A and 5B are views showing a first example of the intermediate stage in the first embodiment.
Figure 5B:
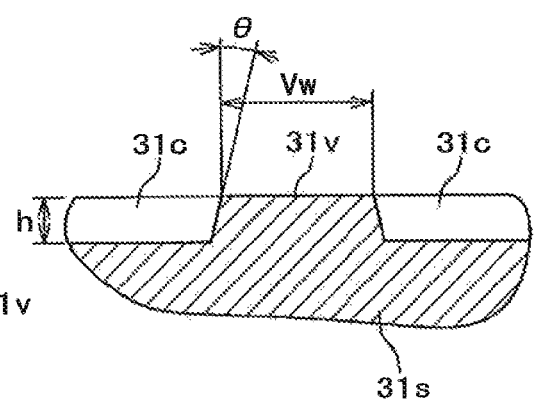

FIGS. 5A and 5B are views showing a first example of the intermediate stage 31 in the first embodiment. FIG. 5A is a view showing the arrangement and shape of the mounting support protrusions 31v that are indicated in black in the central region 31sc shown in FIG. 4A. FIG. 5B is a view showing a surface side of a section taken along A-A line shown in FIG. 5A. Those parts of the mounting support protrusions 31v indicated in black in FIG. 5A represent contact portions with the back surface Db of a die D, and sloping parts shown in FIG. 5B of the mounting support protrusions 31v are not illustrated in FIG. 5A. The same reference numerals are given to those having the same functions in the following examples.

The pattern of the mounting support protrusions 31v in the first example is formed in a matrix form like those in FIG. 4A wherein the pitch of the mounting support protrusions 31v are equal in length and width. At the black-indicated contact surfaces with the back surface Db of a die D, the mounting support protrusions 31v take the shape of a regular square of a width Vw that is rounded at corners to make the manufacturing easy. Further, the pitch between any two mounting support protrusions 31v at the contact surfaces with the back surface Db of the die D becomes Pv−Vw. Further, the height of the mounting support protrusions 31v, that is, the depth of the recesses 31c is h. For ease in manufacturing, the mounting support protrusion 31v is enlarged at an angle of θ as it goes toward the recesses 31c.

Next, the contact area ratio SR in the first example will be discussed. Where the mounting support protrusions 31v are of a pattern not being uniform, the contact area ratio SR depends on the pattern. Herein, discussion will be made as to the contact area ratio SRu where the mounting support protrusions 31v are uniform in pattern. Where a side length L of the stage portion 31s shown in FIG. 4A is used without counting the roundness at the corners of the contact surfaces of the mounting support protrusions 31v with the back surface Db, Expression (3) holds.

$$SRu=(Vw^2 \times N)/L^2 \qquad (3)$$

Here, N: the number of the mounting support protrusions within the stage 31s

The contact area ratio SR required mainly depends on the thickness of dies D. Herein, let thin-film dies being 20 micron-meters or so in thickness be considered as an example. Where other conditions are exemplified as L=20.65 millimeters, Vw=0.35 millimeters and N=225, the contact area ratio SRu becomes about 6.5 percents. In the example of the thin-film dies being 20 micron-meters in thickness, the contact area ratio SR is desirable to be 10 percents or less. Further, the thickness of the die attach film 18 used for the thin-film dies being 20 micron-meters or so in thickness ranges from 20 to 50 micron-meters, and thus, the depth h of the recesses 31c is set to 0.1 millimeters. The mounting support protrusions 31v become 1.2 millimeters in pitch Pv.

As described above, according to the first example, it is possible to provide a highly reliable die bonder that is capable of substantially decreasing the production of cracks, voids or the like in the die D, of surely mounting the die D on the intermediate stage and of surely picking up the die D from the intermediate stage.

Example 2

Figure 6A:
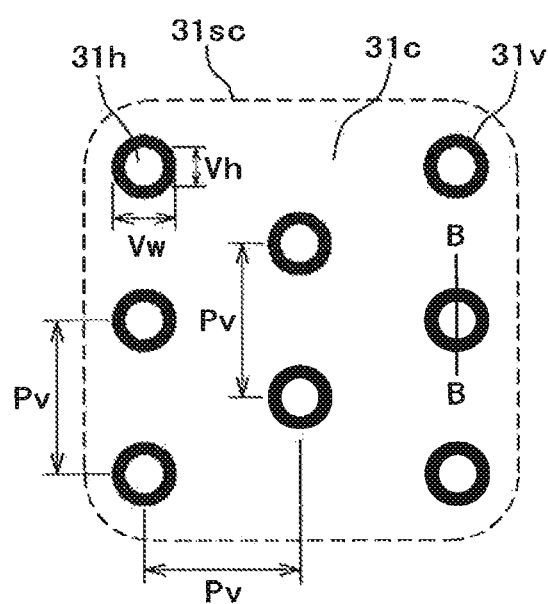
FIGS. 6A and 6B are views showing a second example of the intermediate stage in the first embodiment.
Figure 6B:
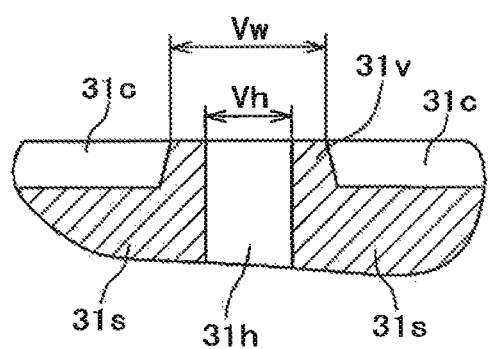

FIGS. 6A and 6B are views showing a second example of the intermediate stage 31 in the first embodiment. FIG. 6A is a view showing the arrangement and shape of mounting support protrusions 31v that are indicated in black in the central region 31sc shown in FIG. 4A. FIG. 6B is a view showing a surface side of a section taken along B-B line shown in FIG. 6A. Those parts of the mounting support protrusions 31v indicated like doughnuts in black in FIG. 6A represent contact portions with the back surface Db of the die D, and sloping parts shown in FIG. 6B of the mounting support protrusions 31v are not illustrated in FIG. 6A.

The second example differs from the first example in the following three points. First, while taking a pillar shape in the first example, the mounting support protrusions 31v in the second example take a cylindrical shape that is provided with an absorption hole 31h of an absorption hole diameter Vh for absorbing and holding the die D on the intermediate stage 31. That is, although in the first example, the mounting support of the die D on the intermediate stage 31 is attained by the adhesive strength of the die attach film 18, the second example utilizes the absorption and holding by air for further reliable mounting and support.

In the second example, since foreign substances can also be removed through the absorption hole 31h, what is high in a possibility of producing cracks, voids or the like in the die D is only the part of the doughnut shape. Therefore, the same conditions as those in the first example are chosen by, for example, setting to Vw the diameter of the contact surface between the mounting support protrusion 31v and the back surface Db, the contact area ratio SR is made to be further smaller by the amount corresponding to the absorption hole 31h than that in the first example.

A second different point resides in that in order to make further smaller the area of the contact surface between the mounting support protrusions 31v and the back surface Db of a die D, that is, the contact area ratio SR, the shape of the contact surface is a doughnut shape indicated in black in the second embodiment though being a regular square in the first embodiment.

A third different point resides in that as opposed to being a matrix in a lattice fashion, the arrangement of the mounting support protrusions 31v in the second embodiment takes a matrix arrangement with those in respective lines shifted in phase, that is, a matrix arrangement that the mounting support protrusions 31v in mutually adjoining lines are shifted in phase.

These three features (different points) are not necessary to be all incorporated. The respective features may be provided independently or in combination. In other words, one or two points of the features may be incorporated.

For example, the die bonder may be of the feature that the stage portion 31s (mounting portion) for mounting thereon a die D picked up by the pickup head 21 from the die supply unit 1 is provided with an uneven pattern which comprises the plurality of mounting support protrusions 31v having contact surfaces flush contacting the back surface Db of a die D for supporting the die D not to slip out of place, the absorption holes 31h provided in the mounting support protrusions 31v for absorbing the die D and the plurality of recesses 31c formed between the mounting support protrusions 31v and that one or those plural of the mounting support protrusions 31v take a doughnut shape. In this case, because of having the absorption holes 31h and the doughnut shape, the contact area ratio SR is made to be smaller than that in the case not so designed, so that the possibility of being capable of excluding foreign substances can be enhanced.

Further, the die bonder may be of the feature that the stage portion 31s (mounting portion) for mounting thereon a die D picked up by the pickup head 21 from the die supply unit 1 is provided with an uneven pattern which comprises the plurality of mounting support protrusions 31v having contact surfaces flush contacting the back surface Db of a die D for supporting the die D not to slip out of place and the plurality of recesses 31c formed between the mounting support protrusions 31v, that one or those plural of the mounting support protrusions 31v take a doughnut shape, and that the mounting support protrusions 31v are in a matrix arrangement with those in mutually adjoining lines differing in phase.

Furthermore, the die bonder may be of the feature that the stage portion 31s (mounting portion) for mounting thereon a die D picked up by the pickup head 21 from the die supply unit 1 is provided with an uneven pattern which comprises the plurality of mounting support protrusions 31v having contact surfaces flush contacting the back surface Db of a die D for supporting the die D not to slip out of place, the absorption holes 31h provided in the mounting support protrusions 31v for absorbing the die D and the plurality of recesses 31c formed between the mounting support protrusions 31v and that the mounting support protrusions 31v are in a matrix arrangement with those in mutually adjoining lines differing in phase. Because the mounting support protrusions 31v are in the matrix arrangement with those in mutually adjoining lines differing in phase, a state can be avoided that foreign substances being long in shape rest like a bridge on the mounting support protrusions 31v in the adjoining lines.

As discussed above, although the aforementioned three features can be utilized independently, the incorporation of these three features makes it possible to further decrease the contact area ratio and to lower the chance for foreign substances to adhere to the die D. Further, the aforementioned expressions for the contact area ratio SR applies as a matter of course to this example and other examples described later, and in the example of the thin-film dies being 20 micron-meters or so in thickness, the contact area ratio SR is desired to be 10 percents or less.

The mounting support protrusions 31v having contact surfaces flush contacting the back surface Db of a die D for supporting the die D not to slip out of place may be mounting support protrusions that contact the back surface of a die at a flat surface including minimal unevenness produced in machining technique as long as the slip out of place does not occur beyond the degree in which the bonding head 41 is able to pick up the die.

As described above, also in the second embodiment, it is possible to provide a highly reliable die bonder that is capable, for example, of stably mounting and supporting the die D thanks to the absorption holes 31h when the die D is mounted on the intermediate stage 31, of substantially decreasing the production of cracks, voids or the like in the die D, of surely mounting the die D on the intermediate stage 31 and of surely picking up the die D from the intermediate stage 31.

Example 3

Figure 7A:
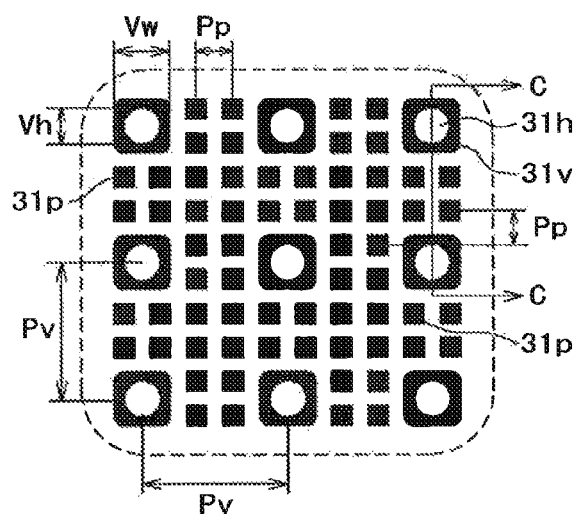
FIGS. 7A to 7C are views showing a third example of the intermediate stage in the first embodiment.
Figure 7B:
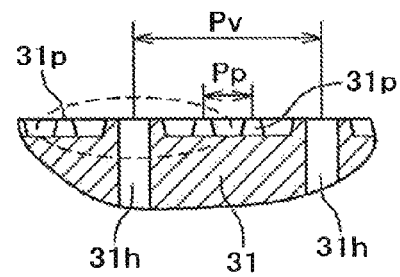
Figure 7C:
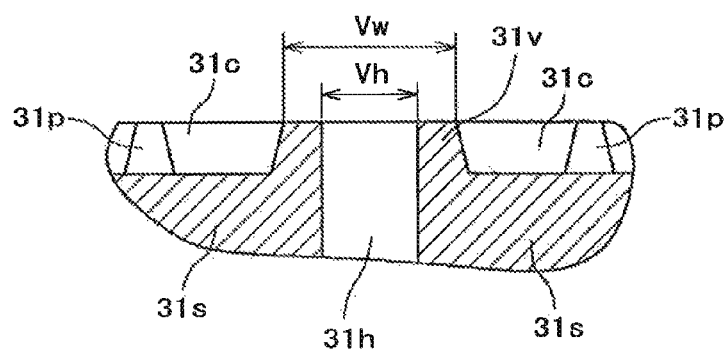

FIGS. 7A to 7C are views showing a third example of the intermediate stage 31 in the first embodiment. FIG. 7A is a view showing the arrangements and shapes of mounting support protrusions 31v and plane keeping protrusions 31p that are indicated in black in the central region 31sc shown in FIG. 4A. FIG. 7B is a view showing a surface side of a section taken along C-C line shown in FIG. 7A. FIG. 7C is a view showing in an enlarged scale a part indicated in a broken line in FIG. 7B. Those parts of the mounting support protrusions 31v and the plane keeping protrusions 31p indicated in black in FIG. 7A represent contact portions with the back surface Db of a die D, and sloping parts of the mounting support protrusions 31v and the plane keeping protrusions 31p shown in FIGS. 7B and 7C are not illustrated in FIG. 7A.

The point in which the third example largely differs from the first and second examples resides in that the plane keeping protrusions 31p are provided between the mounting support protrusions 31v for reducing the flexure of a die D to be kept plane when the die D is mounted on the intermediate stage 31. In other points, there are given constructions that are the same as those in the first or second example or that combines those in the first and second examples.

The plane keeping protrusions 31p take an island array construction in which like the mounting support protrusions 31v, the plane keeping protrusions 31p are a trapezoid in section and at tip end parts thereof, flush contact the back surface Db of a die D together with the tip end parts of the mounting support protrusions 31v. The plane keeping protrusions 31p are a regular square in shape at the tip end parts, whose width Pw is narrower than the width Vw at the tip end parts of the mounting support protrusions 31v. In other words, the contact areas with the back surface Db of the die D are small. For example, in the case of an application to the example shown in the first example, Vw is 0.35 millimeters, than which Pw is 2 micron-meters being two-digit smaller, for example. In terms of the contact area, the mounting support protrusion 31v has 0.1225 square millimeters, while the plane keeping protrusion 31p has $4 \times 10^{-6}$ square millimeters, thus representing a so-called pin shape.

Where a tip end of a pin shape thrusts a die D upward, there arises a possibility that the stress concentration on the tip end of the pin shape causes the pin to break. However, where many pins flush support a die D, the die D can be stably supported without suffering any stress as is true with the case that one does not experience so much pain even when putting his/her hand on a pinholder, and thus, can be prevented from being bent.

For a stable structure, the base side of the plane keeping protrusion 31p is made to be greatly thicker than the tip end side. As opposed to the tip end part being 2 micron-meters, the base end side is set to, for example, 50 micron-meters. Further, like that of the mounting support protrusion 31v, the shape at the tip end part of the plane keeping protrusion 31p may be rectangular, circular or elliptical, and the arrangement of the plane keeping protrusions 31p may not be an island array but be an line array. Further, the plane keeping protrusions 31p are not necessary to be uniform in contact area. In short, the plane keeping protrusions 31p suffice where the same can prevent the flexure of the back surface Db of the die D and thus, can keep the planeness of the back surface Db.

Next, discussion will be made regarding the contact area ratio SR in the third example. As an example, let a case be assumed wherein the dimensions of the stage portion 31s and the dimensions, the number and the like of the mounting support protrusions 31v are set in the same conditions as those in the first example and wherein as shown in FIG. 7A, four plane keeping protrusions 31p are provided between any two adjoining mounting support protrusions 31v. In the case of this example, the number of the plane keeping protrusions 31p reaches as many as about 2500, while the contact area of all of the plane keeping protrusions 31p becomes $4 \times 10^{-6}$ mm$^2 \times 2500 = 0.01$ mm$^2$, whereby the effect on the contact area ratio SR is so small as is neglectable. The pitch Pp of the plane keeping protrusions 31p in this case becomes 0.3 millimeters.

As described above, according to the third example, it is possible to provide a highly reliable die bonder that is capable of suppressing the flexure of the die D to substantially decrease the production of cracks, voids and the like in the die D when the same is mounted on the intermediate stage 31, of surely mounting the die D on the intermediate stage 31 and of surely picking up the die D from the intermediate stage.

Second Embodiment

Figure 8A:
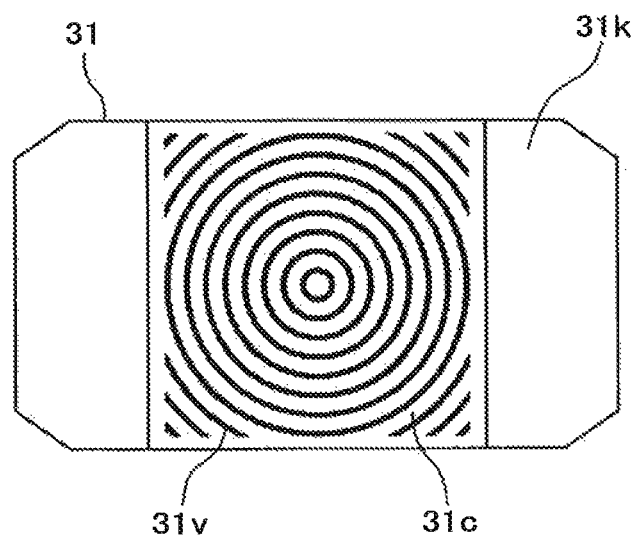
FIGS. 8A and 8B are views showing examples of an intermediate stage in a second embodiment of the present invention.
Figure 8B:
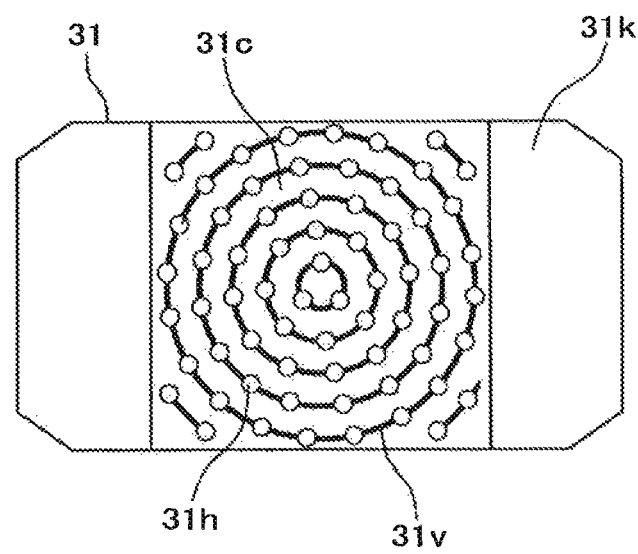

FIGS. 8A and 8B are views showing examples of an intermediate stage 31 being a second embodiment of the present invention. While the contact surfaces at which the mounting support protrusions 31v contact the back surface Db of a die D are in an island array in the first embodiment, mounting support protrusions 31v and recesses 31c in the second embodiment are formed to be beltlike in a concentric circle or ellipse array. FIG. 8A is an example wherein the mounting support protrusions 31v are simply provided to be beltlike in a concentric circle array. FIG. 8B is another example wherein absorption holes 31h are discretely provided in the beltlike parts in the example shown in FIG. 8A. As other examples, beltlike absorption parts may be provided in the beltlike mounting support protrusions 31v, and as is the case of the third example, plane keeping protrusions 31p may be provided between the beltlike mounting support protrusions 31v.

The number of the belts is determined depending on the thickness of dies D.

As described above, according to the second embodiment, it is possible to provide a highly reliable die bonder that is capable of making the contact area ratio small as a result of providing the mounting support protrusions 31v to be beltlike of substantially decreasing the production of cracks, voids or the like in the die D, of surely mounting the die D on the intermediate stage 31 and of surely picking up the die D from the intermediate stage 31.

Third Embodiment

Figure 9A:
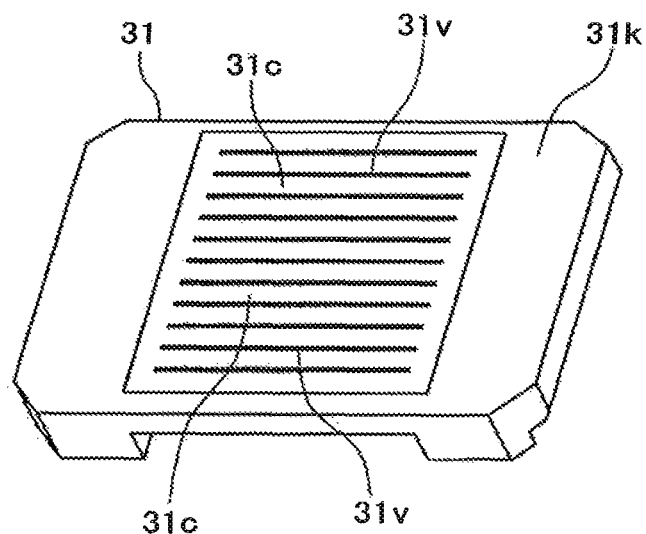
FIGS. 9A and 9B are views showing examples of an intermediate stage in a third embodiment of the present invention.
Figure 9B:
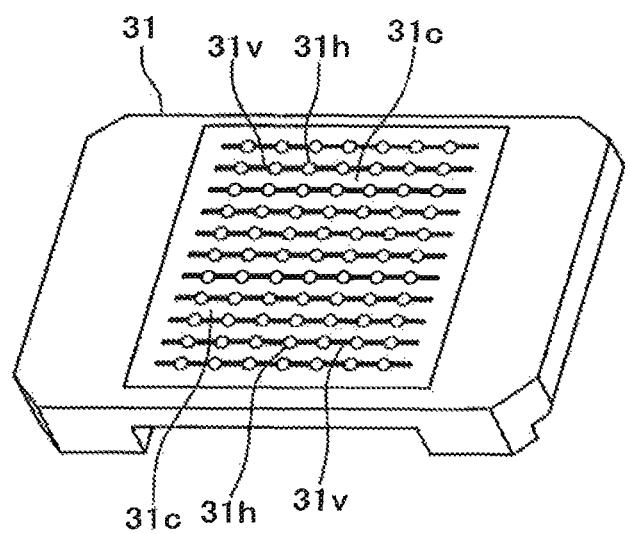

FIGS. 9A and 9B are views showing examples of an intermediate stage 31 in a third embodiment of the present invention. Although being provided on the stage portion 31 to be beltlike in the concentric circle array in the second embodiment, mounting support protrusions 31v and recesses 31c in the third embodiment are provided to be beltlike in parallel to a side of the stage portion 31s. FIG. 9A is an example wherein the mounting support protrusions 31v are provided to be simply parallel and beltlike. FIG. 9B is another example wherein absorption holes 31h are discretely provided in the beltlike parts in the example shown in FIG. 9A. As other examples, beltlike absorption parts 31h may be provided in the beltlike mounting support protrusions 31v, and as is the case of the third example, plane keeping protrusions 31p may be provided between the beltlike mounting support protrusions 31v.

In the third embodiment, since the direction in which the foreign substance removal device 33 blows is made to be parallel to the direction in which the recesses 31c are provided in parallel to a side of the stage portion 31s, the cleaning for the foreign substances in the recesses 31c can be performed efficiently.

The number of the belts is determined depending on the thickness of the dies.

As described above, according to the third implement form, it is possible to provide a highly reliable die bonder that is capable of making the contact area ratio small as a result of providing the mounting support protrusions 31v to be beltlike, of substantially decreasing the production of cracks, voids or the like in the die D, of surely mounting the die D on the intermediate stage 31 and of surely picking up the die D from the intermediate stage 31.

Fourth Embodiment

FIG. 10 is a chart showing one example of a bonding flow where the intermediate stage 31 of the present invention is used in a fourth embodiment of the present invention. Usually, when dies D are bonded on the work W, the bonding head 41 is heated to revive the adhesive strength of the die attach film 18. To the contrary, for example, where the adhesive strength of the die attach film 18 is strong, the die D and the die attach film 18 on the intermediate stage 31 are heated by the heat of the heated bonding head 41, and thus, the die D clings to the intermediate stage 31 and becomes hard to be picked up. Therefore, in order to prevent this, it is necessary to cool the bonding head 41. The time taken for cooling the bonding head 41 like this has caused the productivity to go down.

As described in the first to third embodiments, the contact area ratio SR of the die D with the stage portion 31s is very small in the intermediate stage 31 of the present invention, and thus, even if the die attach film 18 is strong in adhesive strength, the force with which the die D clings to the intermediate stage 31 is substantially weakened. Therefore, where the intermediate stage 31 of the prevent invention is used, the case becomes frequent wherein the cooling of the bonding head 41 is unnecessary.

Accordingly, where the intermediate stage 31 of the prevent invention is used, the bonding flow becomes as follows:

At the outset, a die D is picked up by the pickup head 21 from a wafer 11 (S1). Then, the pickup head 21 is moved to the intermediate stage 31 and mounts the die D thereon (S2). The stage recognition camera 32 picks up the image of the die D on the intermediate stage 31, and the control unit 7 compensates the bonding position and posture onto the work W (S3). The bonding head 41 moved to the intermediate stage 31 picks up the die D from the intermediate stage 31 without being cooled (S4). The heated bonding head 41 bonds the picked-up die D on the work W (S5). A judgment is made of whether cleaning is necessary or not for removing the foreign substances in the recesses 31c of the stage portion 31s (S6). The judgment is made based on the time length taken for the processing performed by that time or the number of processed pieces, and if necessary, cleaning is performed (S7). The processing steps from S1 through S7 are carried out for articles of a predetermined number (S8).

As described above, according to the fourth embodiment, the time taken for cooling the bonding head 41 is not necessary and hence, the productivity can be enhanced.

Further, it may be the case that the cooling of the bonding head 41 is not needed in dependence on the thickness of the dies D or in dependence on the material or adhesive strength of the die attach film 18. Also in the case like this, by providing the intermediate stage 31 described in the first to third embodiments, it is possible to make the contact surface ratio small and to substantially decrease the production of cracks, voids or the like in the dies D. As a result, according to the fourth embodiment, it is possible to provide a highly reliable bonding method that is capable of surely mounting a die D on the intermediate stage 31 and surely picking up the die D from the intermediate stage 31.

As described hereinabove, the embodiments of the present invention have been described. On the basis of the foregoing description, it is possible for any person skilled in the art to make various alternate examples, alterations or modifications, and hence, the present invention encompasses the aforementioned various alternate examples, alterations or modifications without departing from the gist thereof.

What is claimed is:

1. A die bonder comprising:
    an intermediate stage for mounting a die picked up by a pickup head from a die supply unit,
    wherein a mounting portion of the intermediate stage is provided with an uneven pattern including a plurality of mounting support protrusions having contact surfaces that flush contact the back surface of the die for supporting the die not to slip out of place, and a plurality of recesses formed between the mounting support protrusions, and absorption holes for absorbing the die are provided in the mounting support protrusions.

2. The die bonder as set forth in claim 1, wherein the area of the contact surfaces of all of the mounting support protrusions that contact the back surface is 10 percent or less of the area of the back surface.

3. The die bonder as set forth in claim 1, wherein the area of the contact surfaces of all of the mounting support protrusions provided at the mounting portion is 10 percent or less of the area of the mounting portion.

4. The die bonder as set forth in claim 1, wherein the uneven pattern is configured to be higher in density at a central part of the mounting portion than at a peripheral part of the mounting portion.

5. The die bonder as set forth in claim 1, wherein the uneven pattern is configured to be higher in density at a peripheral part of the mounting portion than at a central part of the mounting portion.

6. The die bonder as set forth in claim 1, wherein the contact surfaces of the mounting support protrusions are arranged in an island array.

7. The die bonder as set forth in claim 1, wherein the mounting support protrusions are provided at the mounting portion to be beltlike in a concentric circle or ellipse array.

8. The die bonder as set forth in claim 1, wherein the recesses are provided to be beltlike in parallel to a side of the mounting portion.

9. A bonding method comprising:
a first pickup step of picking up a die by a pickup head from a die supply unit;
a mounting step of mounting the die picked up by the pickup head from the die supply unit on a mounting surface of an intermediate stage;
a second pickup step of picking up the die mounted on the intermediate stage by a bonding head; and
a bonding step of bonding the die on a work or on a die already bonded on the work;
wherein a mounting portion of the intermediate stage is provided with an uneven pattern that varies in density in central and peripheral parts of the mounting portion, including a plurality of mounting support protrusions having contact surfaces that flush contact the back surface of the die for supporting the die not to slip out of place, and a plurality of recesses formed between the mounting support protrusions.

10. The bonding method as set forth in claim 9, wherein a step of heating the bonding head and the second pickup step are performed with the bonding head kept in a heated state.

11. A die bonder, comprising an intermediate stage for mounting a die picked up by a pickup head from a die supply unit,
wherein a mounting portion of the intermediate stage is provided with an uneven pattern that varies in density in central and peripheral parts of the mounting portion, including a plurality of mounting support protrusions having contact surfaces that flush contact the back surface of the die for supporting the die not to slip out of place, and a plurality of recesses formed between the mounting support protrusions, and
plane keeping protrusions having contact surfaces that flush contact the back surface of the die for reducing the flexure of the die to keep planeness are provided between the mounting support protrusions.

12. The die bonder as set forth in claim 11, wherein the area of the contact surfaces of all of the mounting support protrusions that contact the back surface is 10 percent or less of the area of the back surface.

13. The die bonder as set forth in claim 11, wherein the area of the contact surfaces of all of the mounting support protrusions provided at the mounting portion is 10 percent or less of the area of the mounting portion.

14. The die bonder as set forth in claim 11, wherein the uneven pattern is configured to be higher in density at a central part of the mounting portion than in density at a peripheral part of the mounting portion.

15. The die bonder as set forth in claim 11, wherein the uneven pattern is configured to be higher in density at a peripheral part of the mounting portion than in density at a central part of the mounting portion.

16. The die bonder as set forth in claim 11, wherein the contact surfaces of the mounting support protrusions are arranged in an island array.

17. The die bonder as set forth in claim 11, wherein the mounting support protrusions are provided at the mounting portion to be beltlike in a concentric circle or ellipse array.

18. The die bonder as set forth in claim 11, wherein the recesses are provided to be beltlike in parallel to a side of the mounting portion.

* * * * *